(12) United States Patent
Park et al.

(10) Patent No.: US 11,758,675 B2
(45) Date of Patent: Sep. 12, 2023

(54) PANEL FOR DISPLAY DEVICE, METHOD OF MANUFACTURING THE SAME, AND PANEL ASSEMBLY

(71) Applicant: KORTEK CORPORATION, Incheon (KR)

(72) Inventors: Ki Hoon Park, Seoul (KR); Chan Hwan Kim, Incheon (KR); Son Ou Lee, Seoul (KR)

(73) Assignee: KORTEK CORPORATION, Incheon (KR)

( * ) Notice: Subject to any disclaimer, the term of this patent is extended or adjusted under 35 U.S.C. 154(b) by 0 days.

(21) Appl. No.: 17/699,218

(22) Filed: Mar. 21, 2022

(65) Prior Publication Data

US 2023/0180412 A1   Jun. 8, 2023

(30) Foreign Application Priority Data

Dec. 8, 2021  (KR) .................. 10-2021-0174978

(51) Int. Cl.
*H05K 5/03* (2006.01)
*H05K 5/00* (2006.01)
*G06F 3/041* (2006.01)

(52) U.S. Cl.
CPC ............. *H05K 5/03* (2013.01); *G06F 3/041* (2013.01); *H05K 5/0017* (2013.01); *H05K 5/0021* (2013.01)

(58) Field of Classification Search
CPC ...... H05K 5/03; H05K 5/0017; H05K 5/0021; G06F 3/041
See application file for complete search history.

(56) References Cited

U.S. PATENT DOCUMENTS

| | | | |
|---|---|---|---|
| 8,442,593 B1* | 5/2013 | Kwon | H04M 1/0266 455/575.8 |
| 2011/0221995 A1* | 9/2011 | Park | G02F 1/13336 349/58 |
| 2015/0009587 A1* | 1/2015 | Kim | G02B 5/045 359/837 |
| 2015/0293389 A1* | 10/2015 | Zhang | G02F 1/133308 349/73 |
| 2020/0043388 A1* | 2/2020 | Hicks | E05D 5/121 |
| 2020/0102977 A1* | 4/2020 | Kim | F16M 13/02 |

FOREIGN PATENT DOCUMENTS

| | | | |
|---|---|---|---|
| KR | 20110092017 A | * | 8/2011 |
| KR | 20210034683 A | | 3/2021 |

* cited by examiner

*Primary Examiner* — Doon Y Chow
(74) *Attorney, Agent, or Firm* — Schmeiser, Olsen & Watts, LLP

(57) ABSTRACT

Provided is a panel for a display device, a method of manufacturing the same, and a panel assembly including the panel for a display device. The panel for a display device includes a first unit panel and a second unit panel that are consecutively disposed, and a junction configured to bond and connect an edge surface of the first unit panel to an edge surface of the second unit panel facing the edge surface of the first unit panel.

11 Claims, 9 Drawing Sheets

PANEL FOR DISPLAY DEVICE, METHOD OF MANUFACTURING THE SAME, AND PANEL ASSEMBLY

CROSS-REFERENCE TO RELATED APPLICATION

This application claims priority to Korean Patent Application No. 10-2021-0174978, having a filing date of Dec. 8, 2021, the contents of which is hereby incorporated by reference.

FIELD OF TECHNOLOGY

The following relates to a display device, and more particularly, to a panel for a display device, such as a display panel or a protective glass panel, a method of manufacturing the panel for a display device, and a panel assembly including the panel for a display device.

BACKGROUND

Generally, a display device includes a display panel having a front surface on which an image is displayed, and a protective glass panel for protecting the front surface of the display panel. Such a display device is not limited to having a traditional flat display panel and protective glass panel but is evolving to include a curved or bent display panel and protective glass panel according to the purpose of use.

However, it is technically difficult to manufacture a protective glass panel or a display panel in a curved or bent form, a yield of good products is low, and an amount of waste that is thrown away from input materials used for manufacturing is increased, resulting in low productivity and high manufacturing costs.

Meanwhile, even in the case of a traditional flat protective glass panel or display panel, a size of the panel itself is gradually increasing. In the case of a large-sized protective glass panel or display panel, flatness management is difficult, resulting in low productivity and high manufacturing costs.

As the related art, Korean Unexamined Patent Application Publication No. 10-2021-0034683 (Published on Mar. 30, 2021, titled: Vehicle interior system having curved surface cover glass and display or touch panel, and method of forming the same) is disclosed.

SUMMARY

An aspect relates to providing a panel for a display device with high productivity and reduced manufacturing costs, a method of manufacturing the panel for a display device, and a panel assembly including the panel for a display device.

According to an aspect of embodiments of the present invention, there is provided a panel for a display device, including a first unit panel and a second unit panel that are consecutively disposed, and a junction configured to bond and connect an edge surface of the first unit panel to an edge surface of the second unit panel facing the edge surface of the first unit panel.

Each of the first unit panel and the second unit panel may include a transparent glass panel.

Each of the first unit panel and the second unit panel may further include a touch sensing unit attached to a rear surface of the transparent glass panel.

Each of the first unit panel and the second unit panel may further include a bezel layer formed by printing and curing an opaque paint on an outer peripheral portion of the transparent glass panel, wherein a width of the bezel layer printed in a region of the outer peripheral portion close to an edge surface bonded to the junction may be smaller than a width of the bezel layer printed in a region of the outer peripheral portion far from the edge surface bonded to the junction.

Each of the first unit panel and the second unit panel may include a display panel having a front surface on which an image is displayed.

The junction may include a bonding frame which is interposed between the edge surface of the first unit panel and the edge surface of the second unit panel and has an internal space formed therein, wherein outlets are formed in a first side surface of the bonding frame, which faces and is in contact with the edge surface of the first unit panel, and a second side surface of the bonding frame, which faces and is in contact with the edge surface of the second unit panel, and an inlet is formed in a front surface of the bonding frame in which the outlets are not formed, and include an adhesive which fills the internal space of the bonding frame through the inlet and is applied to and cured on the edge surface of the first unit panel and the edge surface of the second unit panel through the outlets.

The bonding frame may further include flanges that extend in close contact with rear surfaces of the first unit panel and the second unit panel.

According to another aspect of embodiments of the present invention, there is provided a method of manufacturing a panel for a display device, which is a method of manufacturing the panel for a display device, the method including a jig providing operation of providing a jig including a first unit panel support surface that supports the first unit panel and a second unit panel support surface that supports the second unit panel, a unit panel mounting operation of placing and supporting the first unit panel on the first unit panel support surface and placing and supporting the second unit panel on the second unit panel support surface, and a junction forming operation of forming a junction.

The junction forming operation may include a bonding frame providing operation of providing a bonding frame having an internal space formed therein, outlets formed in a first side surface of the bonding frame, which faces and is in contact with an edge surface of the first unit panel, and a second side surface of the bonding frame, which faces and is in contact with an edge surface of the second unit panel, and an inlet formed in a front surface of the bonding frame in which the outlets are not formed, a bonding frame mounting operation of placing and supporting the bonding frame on the jig so that the first side surface of the bonding frame faces and is in contact with the edge surface of the first unit panel, the second side surface of the bonding frame faces and is in contact with the edge surface of the second unit panel, and the inlet is exposed, an adhesive introducing operation of introducing an adhesive into the bonding frame through the inlet so that the internal space of the bonding frame is filled with the adhesive and the adhesive is applied onto the edge surface of the first unit panel and the edge surface of the second unit panel through the outlets, and an adhesive curing operation of curing the adhesive.

The bonding frame may further include flanges that extend in close contact with rear surfaces of the first unit panel and the second unit panel, wherein a bonding frame mounting groove, in which the flanges are placed between the first unit panel support surface and the second unit panel support surface, may be formed in the jig, and in the bonding frame mounting operation, the bonding frame may be mounted on the jig so that the flanges are placed in the bonding frame mounting groove.

The junction forming operation may include a release film attachment operation of attaching a release film between the first unit panel support surface and the second unit panel support surface so as to overlap a rear surface of the first unit panel around an edge surface thereof and a rear surface of the second unit panel around an edge surface thereof, an adhesive introducing operation of introducing and filling an adhesive into a space between the edge surface of the first unit panel and the edge surface of the second unit panel, and an adhesive curing operation of curing the adhesive.

Each of the first unit panel and the second unit panel may include a transparent glass panel, and the method of manufacturing the panel for a display device may further include a bezel layer forming operation of forming a bezel layer by printing and curing an opaque paint on an outer peripheral portion of the transparent glass panel.

According to still another aspect of embodiments of the present invention, there is provided a panel assembly including a display panel, the display panel includes a display unit, and a protective glass portion disposed in front of the display unit and configured to protect the display unit, wherein each of a first unit panel and a second unit panel of the protective glass portion includes a transparent glass panel, and each of the first unit panel and the second unit panel of the display unit has a front surface on which an image is displayed.

According to yet another aspect of embodiments of the present invention, there is provided a panel assembly including a panel for a display device, the panel for a display device includes a display unit, and a protective glass portion disposed in front of the display unit and configured to protect the display unit, wherein the protective glass portion includes a first unit panel and a second unit panel that are consecutively disposed, and a junction configured to bond and connect an edge surface of the first unit panel to an edge surface of the second unit panel facing the edge surface of the first unit panel.

BRIEF DESCRIPTION OF THE DRAWINGS

Some of the embodiments will be described in detail, with reference to the following figures, wherein like designations denote like members, wherein.

DETAILED DESCRIPTION

Hereinafter, a panel for a display device, a method of manufacturing the same, and a panel assembly including the panel for a display device according to embodiments of the present invention will be described in detail with reference the accompanying drawings. Terminologies used in this specification are terminologies used to properly express exemplary embodiments of the present invention, which may vary depending on a user or operator's intentions or customs in the art to which embodiments of the present invention belongs. Therefore, the meanings of these terminologies should be interpreted based on the scope throughout this specification.

Figure 1:
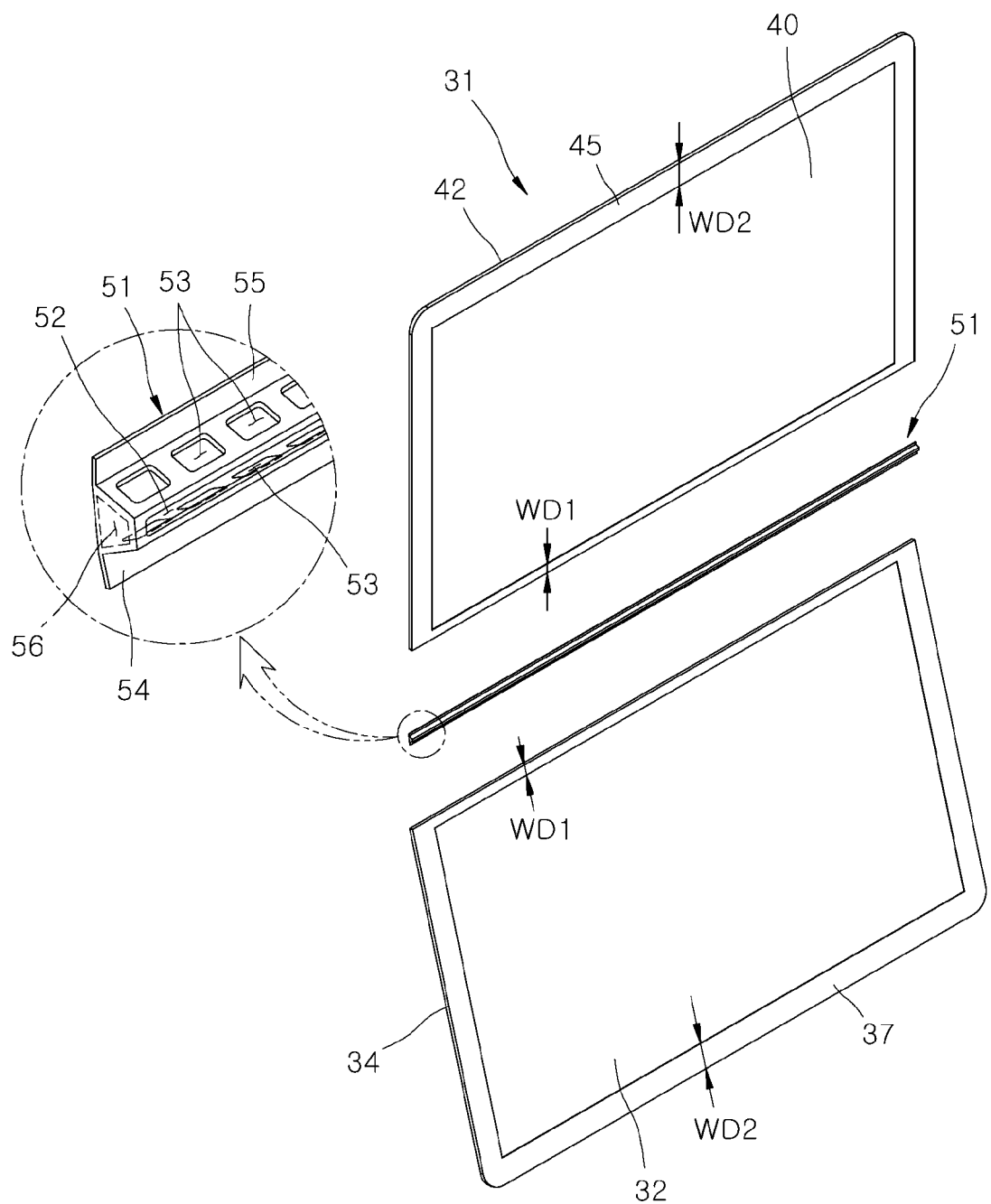
FIG. 1 is an exploded perspective view illustrating a panel for a display device according to a first embodiment of the present invention.
Figure 2:
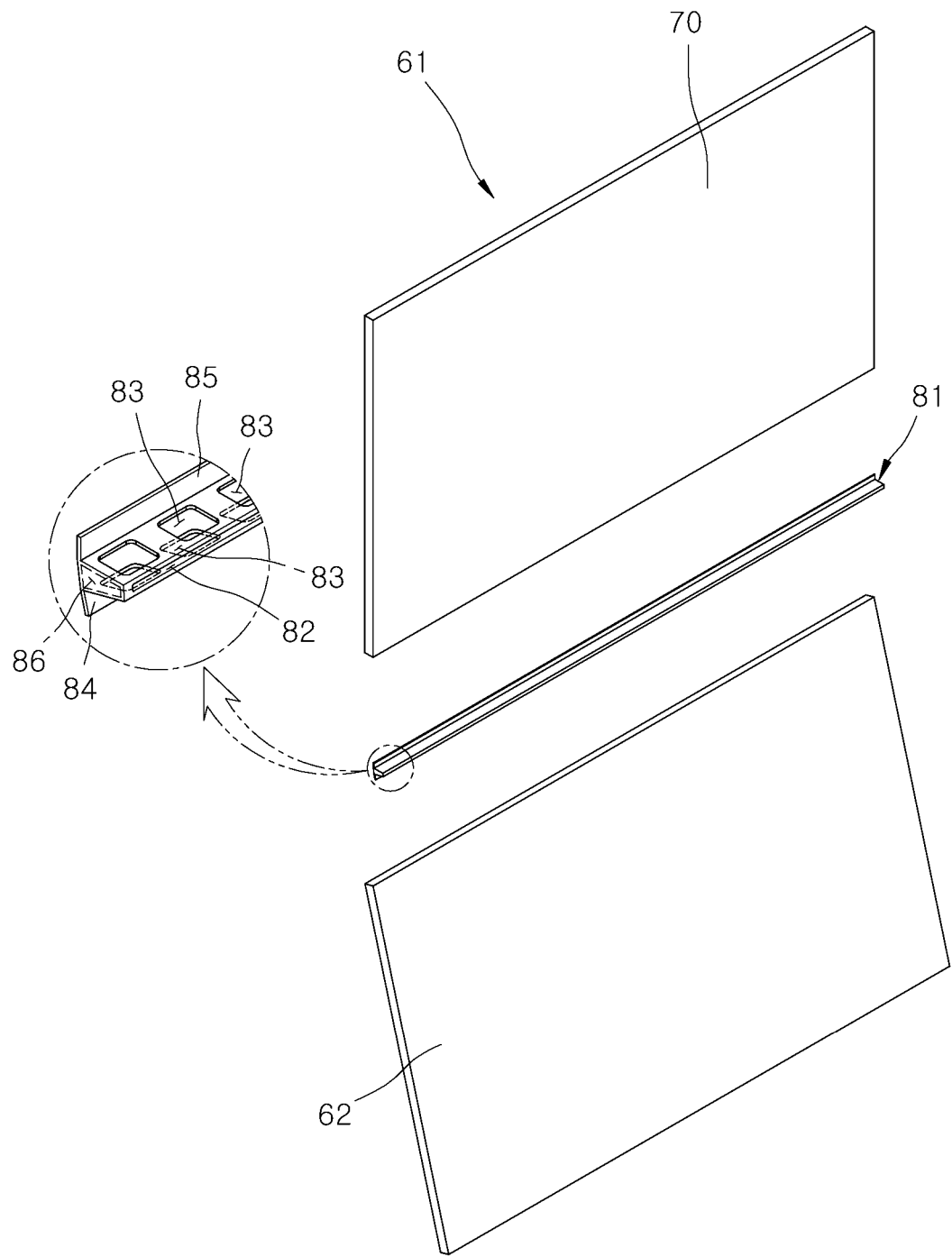
FIG. 2 is an exploded perspective view illustrating a panel for a display device according to a second embodiment of the present invention.
Figure 3:
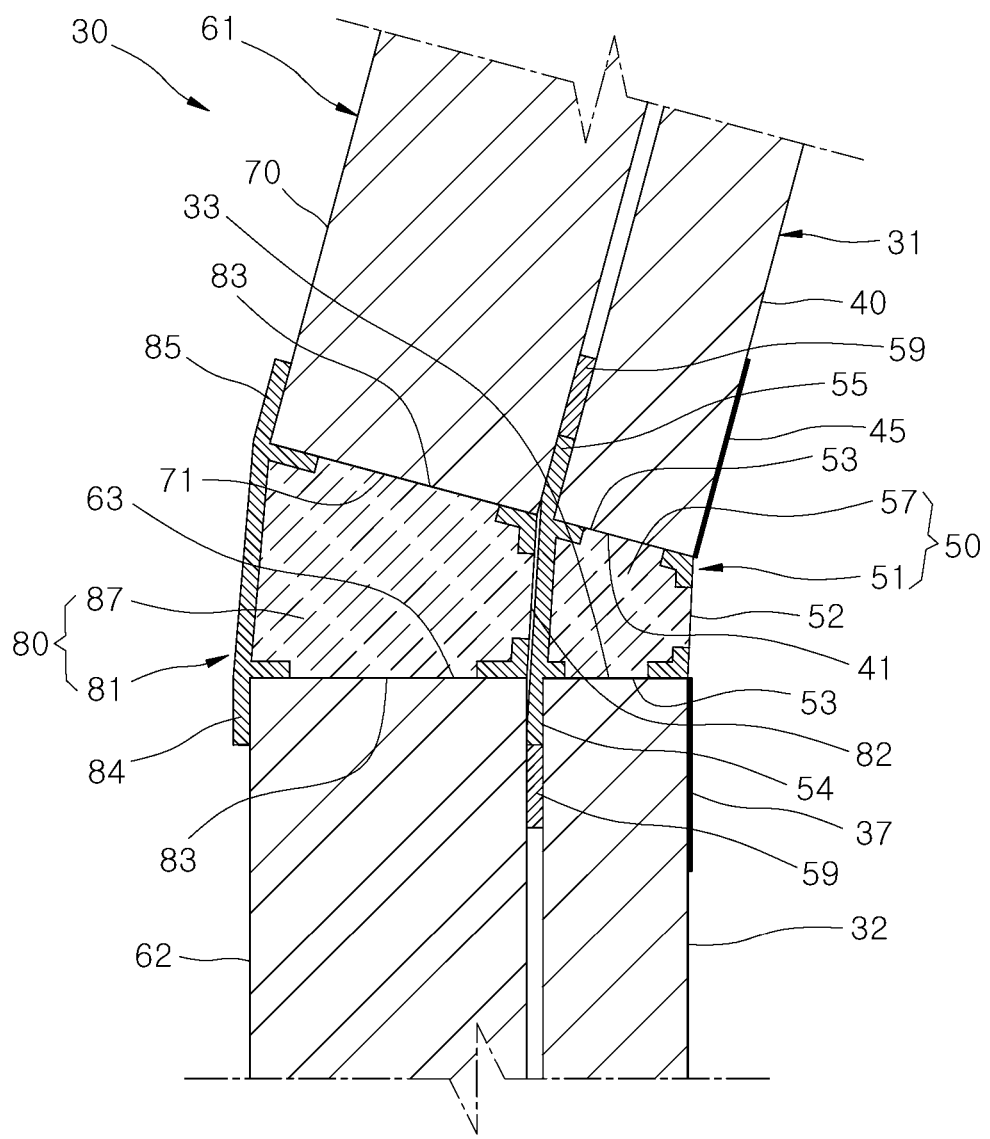
FIG. 3 is a cross-sectional view illustrating a panel assembly including the panel for a display device of FIG. 1 and the panel for a display device of FIG. 2.

FIG. 1 is an exploded perspective view illustrating a panel for a display device according to a first embodiment of the present invention, FIG. 2 is an exploded perspective view illustrating a panel for a display device according to a second embodiment of the present invention, and FIG. 3 is a cross-sectional view illustrating a panel assembly including the panel for a display device of FIG. 1 and the panel for a display device of FIG. 2.

Referring to FIGS. 1 and 3, a panel 31 for a display device according to the first embodiment of the present invention includes a first unit panel 32 and a second unit panel 40 that are consecutively disposed, and a junction 50 that bonds and connects an edge surface 33 of the first unit panel 32 to an edge surface 41 of the second unit panel 40 facing the edge surface 33 of the first unit panel 32. The panel 31 for a display device according to the first embodiment of the present invention is a protective glass portion of the display device, of which an intermediate portion is bent.

Each of the first unit panel 32 and the second unit panel 40 includes a transparent glass panel. Each of the first unit panel 32 and the second unit panel 40 may further include a touch sensing unit (not illustrated) on a rear surface thereof.

The transparent glass panel having a touch sensing unit may be referred to as touch screen panel (TSP) glass. The touch sensing unit may be formed in the form of a flexible film that can be bent or in the form of a hard panel that cannot be bent.

The first unit panel 32 and the second unit panel 40 include bezel layers 37 and 45, respectively, which are formed by printing and curing an opaque paint such as black paint on an outer peripheral portion of the transparent glass panel. In an embodiment, each of the bezel layers 37 and 45 may be stacked on an outer peripheral portion of a front surface of the transparent glass panel or may be stacked on an outer peripheral portion of a rear surface thereof.

The junction 50 includes a bonding frame 51 and an adhesive 57. The bonding frame 51 is interposed between the edge surface 33 of the first unit panel 32 and the edge surface 41 of the second unit panel 40 facing each other. The bonding frame 51 includes a bonding frame main body having an internal space 56 formed therein and a cross section that has a substantially trapezoidal shape, and a first flange 54 and a second flange 55 that extend from the bonding frame main body to be in close contact with rear surfaces of the first unit panel 32 and the second unit panel 40.

The bonding frame main body has a first side surface and a second side surface in which outlets 53 are formed, and a front surface on which inlets 52 are formed. The first side surface of the bonding frame main body faces and is in contact with the edge surface 33 of the first unit panel 32, and the second side surface of the bonding frame main body faces and is in contact with the edge surface 41 of the second unit panel 40. The front surface of the bonding frame main body is exposed to front surfaces of the first unit panel 32 and the second unit panel 40. The bonding frame 51 may be formed of, for example, an elastic material such as rubber.

The internal space 56 of the bonding frame 51 is filled with the adhesive 57 through the inlets 52, and the adhesive 57 is applied to and cured on the edge surface 33 of the first unit panel 32 and the edge surface 41 of the second unit panel 40 through the outlets 53. The adhesive 57 may be, for example, an epoxy adhesive.

Referring to FIGS. 2 and 3 together, a panel 61 for a display device according to the second embodiment of the present invention includes a first unit panel 62 and a second unit panel 70 that are consecutively disposed, and a junction 80 that bonds and connects an edge surface 63 of the first unit panel 62 to an edge surface 71 of the second unit panel 70 facing the edge surface 63 of the first unit panel 62. The panel 61 for a display device according to the second embodiment of the present invention is a display unit of the display device, of which an intermediate portion is bent.

Each of the first unit panel 62 and the second unit panel 70 includes a display panel having a front surface on which an image is displayed. The display panel may be, for example, a liquid-crystal module (LCM) having a liquid-crystal display (LCD) panel that does not emit light by itself and a backlight unit (BLU) that is disposed behind the LCD panel to transmit white light toward the LCD panel. Alternatively, the display panel may be, for example, a self-emitting display panel such as an organic light emitting diode (OLED) panel.

The junction 80 includes a bonding frame 81 and an adhesive 87. The bonding frame 81 is interposed between the edge surface 63 of the first unit panel 62 and the edge surface 71 of the second unit panel 70 facing each other. The bonding frame 81 includes a bonding frame main body having an internal space 86 formed therein and a cross section that has a substantially trapezoidal shape, and a first flange 84 and a second flange 85 that extend from the bonding frame main body to be in close contact with rear surfaces of the first unit panel 62 and the second unit panel 70.

The bonding frame main body has a first side surface and a second side surface in which outlets 83 are formed, and front surface on which inlets 82 are formed. The first side surface of the bonding frame main body faces and is in contact with the edge surface 63 of the first unit panel 62, and the second side surface of the bonding frame main body faces and is in contact with the edge surface 71 of the second unit panel 70. The front surface of the bonding frame main body is exposed to front surfaces of the first unit panel 62 and the second unit panel 70. The bonding frame 81 may be formed of, for example, an elastic material such as rubber.

The internal space 86 the bonding frame 81 is filled with the adhesive 87 through the inlets 82 and the adhesive 87 is applied to and cured on the edge surface 63 of the first unit panel 62 and the edge surface 71 of the second unit panel 70 through the outlets 83. The adhesive 87 may be, for example, an epoxy adhesive.

A panel assembly 30 according to the embodiment of the present invention includes the panel 61 for a display device according to the second embodiment of the present invention as a display unit on which an image is displayed, and the panel 31 for a display device according to the first embodiment of the present invention as a protective glass portion for protecting the display unit. On an outer side of the display panel constituting the display unit 61, for example, electrodes or the like are disposed, and thus no image is displayed. The bezel layers 37 and 45 of the protective glass portion 31 cover the outer side of the display panel so as not to be exposed forward.

Among the bezel layers 37 and 45 of the protective glass portion 31 illustrated in FIG. 1, widths WD1 of the bezel layers 37 and 45 printed in regions of the outer peripheral portions close to the edge surfaces 33 and 41 bonded to the junction 50 are smaller than widths WD2 of the bezel layers 37 and 45 printed in regions of the outer peripheral portions relatively far from the edge surfaces 33 and 41 bonded to the junction 50. In other words, the widths WD2 of the bezel layers 37 and 45 printed in regions of the outer peripheral portions close to edge surfaces 34 and 42 other than the edge surfaces 33 and 41 bonded to the junction 50 are greater than the widths WD1 of the bezel layers 37 and 45 printed in regions of the outer peripheral portions close to the edge surfaces 33 and 41 bonded to the junction 50. This is because the components that need to be covered are disposed behind the bezel layers 37 and 45 printed in the regions of the outer peripheral portions close to the edge surfaces 34 and 42 other than the edge surfaces 33 and 41 bonded to the junction 50 to have a greater width.

Meanwhile, unlike illustrated in FIG. 1, in the conventional case in which a curved protective glass portion is manufactured by deforming or cutting a single transparent glass panel, light distortion occurs in a bent region in the middle of flat regions at both sides so that an accurate image cannot be displayed, and thus an intermediate bezel layer that covers the bent region is stacked and formed. In this case, as a bending angle of the protective glass portion is increased, widths of the bent region and the intermediate bezel layer that covers the bent region are increased. Accordingly, in the conventional curved protective glass portion, the width of the intermediate bezel layer is greater than or equal to a width of a bezel layer formed on an edge of the protective glass portion.

However, among the bezel layers 37 and 45 of the protective glass portion 31 illustrated in FIG. 1, the widths WD1 of the bezel layers 37 and 45 printed in regions of the outer peripheral portions close to the edge surfaces 33 and 41 bonded to the junction 50 are constant regardless of an angle between the first unit panel 32 and the second unit panel 40. Therefore, in the case of the protective glass portion 31 illustrated in FIG. 1, the sum of the width WD1 of the bezel layers 37 and 45 of the first unit panel 32 and the second unit panel 40 and the width of the bonding frame 51 is easily designed to be smaller than the width of the intermediate bezel layer in the conventional curved protective glass portion. Accordingly, the intermittence of the image in the bent region is minimized, and thus the image quality perceived by the viewer is improved.

The display unit 61 and the protective glass portion 31 may be bonded to each other using a double-sided adhesive tape 59. The double-sided adhesive tape 59 may be covered by the bezel layers 37 and 45 so as not to be exposed. The panel assembly 30 may be provided in a housing (not illustrated) of the display device (not illustrated). A controller, a power supply, a communication unit, and the like of the display device may be provided inside the housing of the display device and behind the display unit 61.

Figure 4:
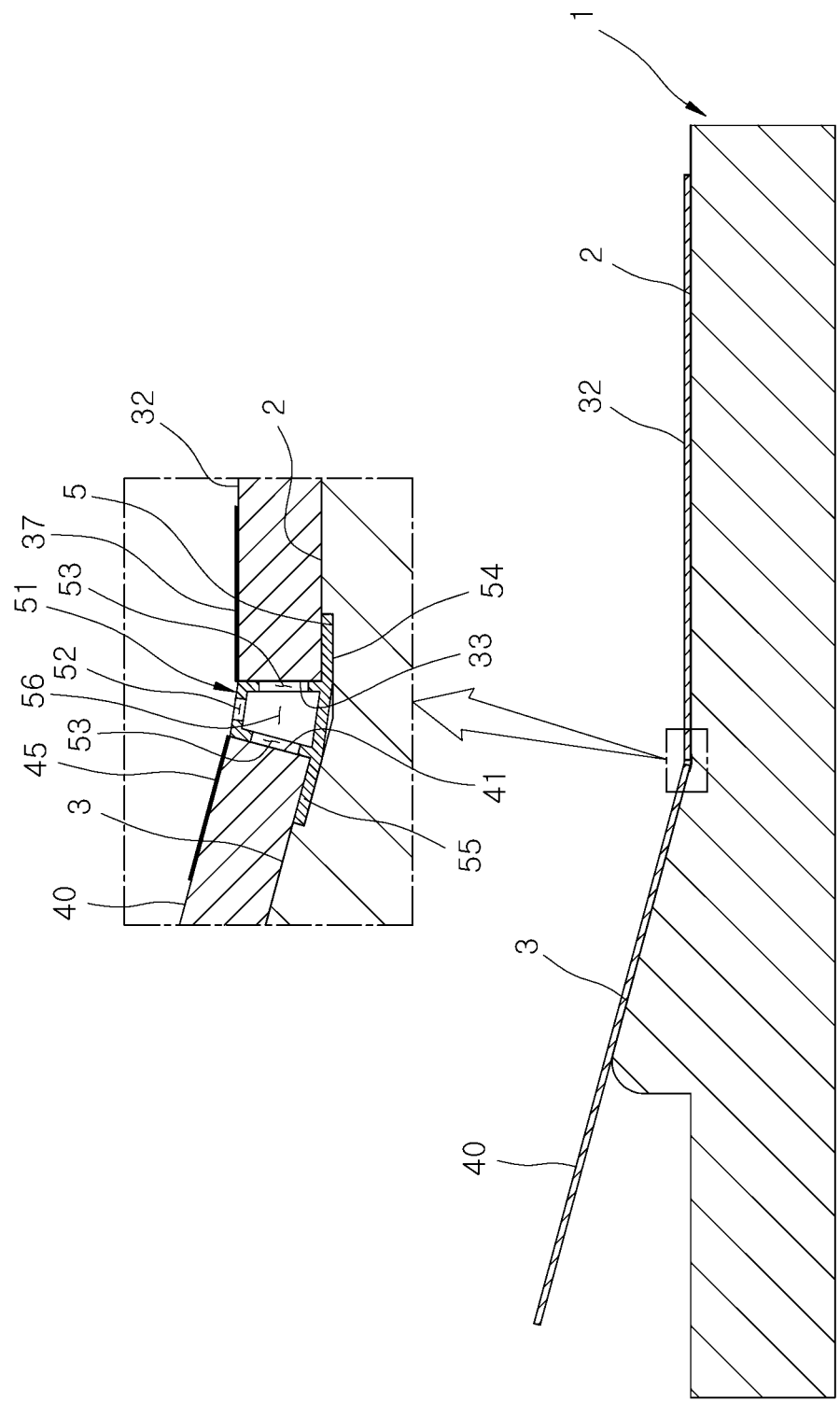
FIG. 4 is a cross-sectional view for describing a method of manufacturing the panel for a display device of FIG. 1.

FIG. 4 is a cross-sectional view for describing a method of manufacturing the panel for a display device of FIG. 1.

Referring to FIGS. 1 and 4 together, a method of manufacturing the panel 31 for a display device according to the first embodiment of the present invention, that is, a method of manufacturing a protective glass portion, includes forming a bezel layer, providing a jig, mounting a unit panel, and forming a junction. The forming of the bezel layer is an operation of forming bezel layers 37 and 45 by printing and curing an opaque paint on outer peripheral portions of a protective glass panel constituting a first unit panel 32 and a protective glass panel constituting a second unit panel 40.

The providing of the jig is an operation of providing a jig 1 having a first unit panel support surface 2 that supports the first unit panel 32 so as to be in surface contact therewith and a second unit panel support surface 3 that supports the second unit panel 40 so as to be in surface contact therewith. An angle between the first unit panel support surface 2 and the second unit panel support surface 3 is identical to an angle between the first unit panel 32 and the second unit panel 40. A bonding frame mounting groove 5, in which a first flange 54 and a second flange 55 of a bonding frame 51 disposed between the first unit panel support surface 2 and the second unit panel support surface 3, and a rear surface of a bonding frame main body disposed between the first flange 54 and the second flange 55 are placed, is formed in the jig 1.

The mounting of the unit panel is an operation of placing and supporting the first unit panel 32 on the first unit panel support surface 2 and placing and supporting the second unit panel 40 on the second unit panel support surface 3. In the junction forming operation, a junction 50 is formed. Specifically, the forming of the junction includes providing a bonding frame, mounting the bonding frame, introducing an adhesive, and curing the adhesive.

The providing of the bonding frame is an operation of providing the bonding frame 51 illustrated in FIGS. 1 and 3, and the bonding frame 51 has already been described in detail, and thus a description thereof will not be repeated. The mounting of the bonding frame is an operation of placing and supporting the bonding frame 51 on the jig 1 so that a first side surface of the bonding frame main body faces and is in contact with an edge surface 33 of the first unit panel 32, a second side surface of the bonding frame main body faces and is in contact with an edge surface 41 of the second unit panel 40, and an inlet 52 of the bonding frame 51 is exposed without being covered.

In this case, an operator may easily place the bonding frame 51 at a correct position of the jig 1 by placing the bonding frame on the jig 1 so that the first flange 54 and the second flange 55 of the bonding frame 51, and the rear surface of the bonding frame main body are placed in the bonding frame mounting groove 5. The providing of the bonding frame and the mounting of the junction may be performed prior to the mounting of the unit panel.

The introducing of the adhesive is an operation of introducing the adhesive 57 (see FIG. 3) into the bonding frame 51 through the inlet 52 of the bonding frame 51. In the introducing of the adhesive, an internal space 56 of the bonding frame 51 is filled with the adhesive 57, and the adhesive 57 is applied to an edge surface 33 of the first unit panel 32 and an edge surface 41 of the second unit panel 40 through an outlet 53. The curing of the adhesive is an operation of curing the adhesive 57 which is introduced into the bonding frame 51 through the inlet 52.

Figure 5:
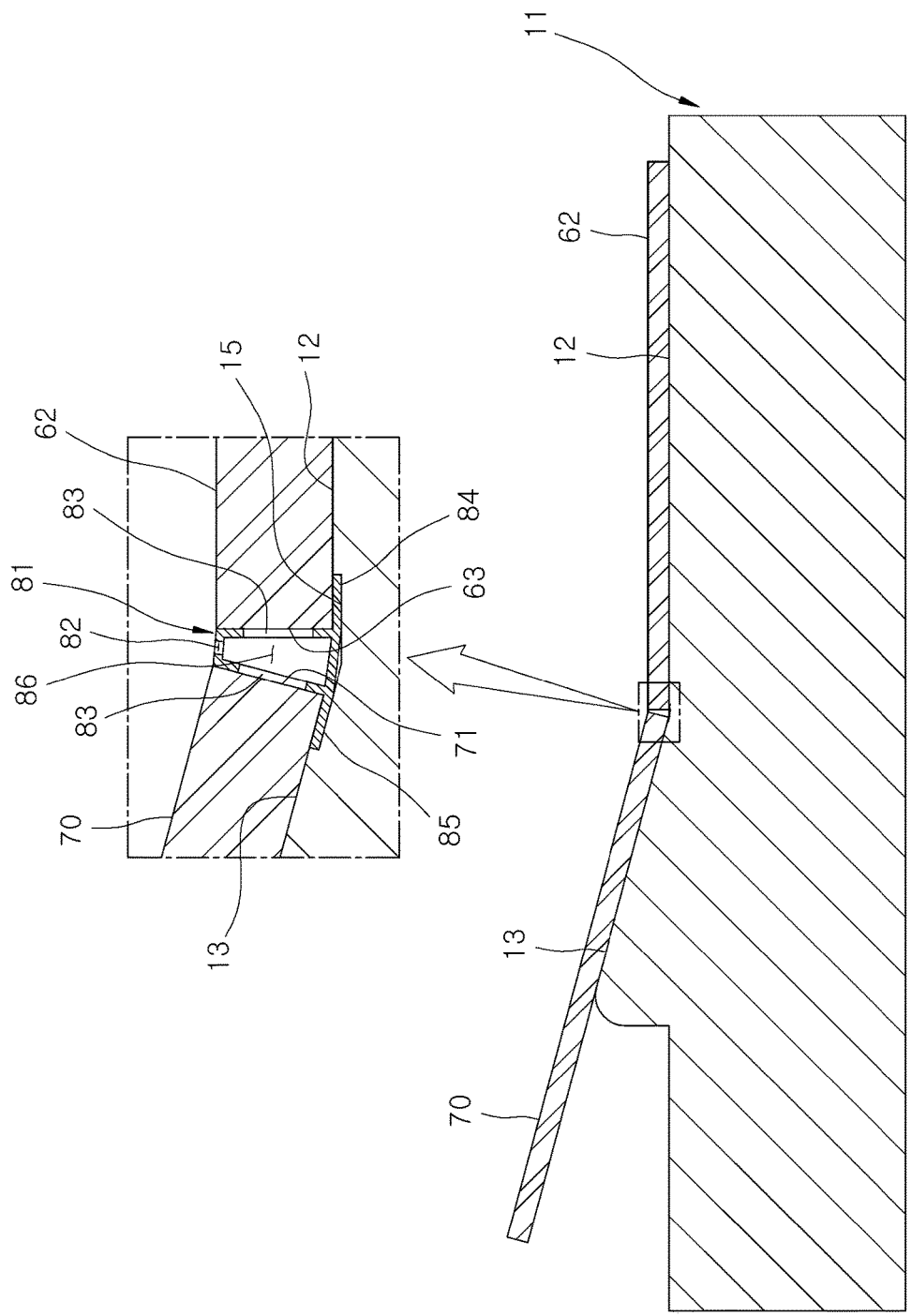
FIG. 5 is a cross-sectional view for describing a method of manufacturing the panel for a display device of FIG. 2.

FIG. 5 is a cross-sectional view for describing a method of manufacturing the panel for a display device of FIG. 2. Referring to FIGS. 2 and 5 together, a method of manufacturing the panel 61 for a display device according to the second embodiment of the present invention, that is, a method of manufacturing a display unit, includes providing a jig, mounting a unit panel, and forming a junction.

The providing of the jig is an operation of providing a jig 11 having a first unit panel support surface 12 that supports a first unit panel 62 so as to be in surface contact therewith and a second unit panel support surface 13 that supports a second unit panel 70 so as to be in surface contact therewith. An angle between the first unit panel support surface 12 and the second unit panel support surface 13 is identical to an angle between the first unit panel 62 and the second unit panel 70. A bonding frame mounting groove 15, in which a first flange 84 and a second flange 85 of a bonding frame 81 disposed between the first unit panel support surface 12 and the second unit panel support surface 13, and a rear surface of the bonding frame main body disposed between the first flange 84 and the second flange 85 are placed, is formed in the jig 11.

The mounting of the unit panel is an operation of placing and supporting the first unit panel 62 on the first unit panel support surface 12 and placing and supporting the second unit panel 70 on the second unit panel support surface 13. In the forming of the junction, a junction 80 is formed. Specifically, the forming of the junction includes providing a bonding frame, mounting the bonding frame, introducing an adhesive, and curing the adhesive.

The providing of the bonding frame is an operation of providing the bonding frame 81 illustrated in FIGS. 2 and 3, and the bonding frame 81 has already been described in detail, and thus a description thereof will not be repeated. The mounting of the bonding frame is an operation of placing and supporting the bonding frame 81 on the jig 11 so that a first side surface of the bonding frame main body faces and is in contact with an edge surface 63 of the first unit panel 62, a second side surface of the bonding frame main body faces and is in contact with an edge surface 71 of the second unit panel 70, and an inlet 82 of the bonding frame 81 is exposed without being covered.

In this case, an operator may easily place the bonding frame 81 at a correct position of the jig 11 by placing the bonding frame on the jig 11 so that the first flange 84 and the second flange 85 of the bonding frame 81, and the rear surface of the bonding frame main body are placed in the bonding frame mounting groove 15. The providing of the bonding frame and the mounting of the junction may be performed prior to the mounting of the unit panel.

The introducing of the adhesive is an operation of introducing the adhesive 87 (see FIG. 3) into the bonding frame 81 through the inlet 82 of the bonding frame 81. In the introducing of the adhesive, an internal space 86 of the bonding frame 81 is filled with the adhesive 87, and the adhesive 87 is applied to the edge surface 63 of the first unit panel 62 and the edge surface 71 of the second unit panel 70 through an outlet 83. The curing of the adhesive is an operation of curing the adhesive 87 which is introduced into the bonding frame 81 through the inlet 82.

Figure 6:
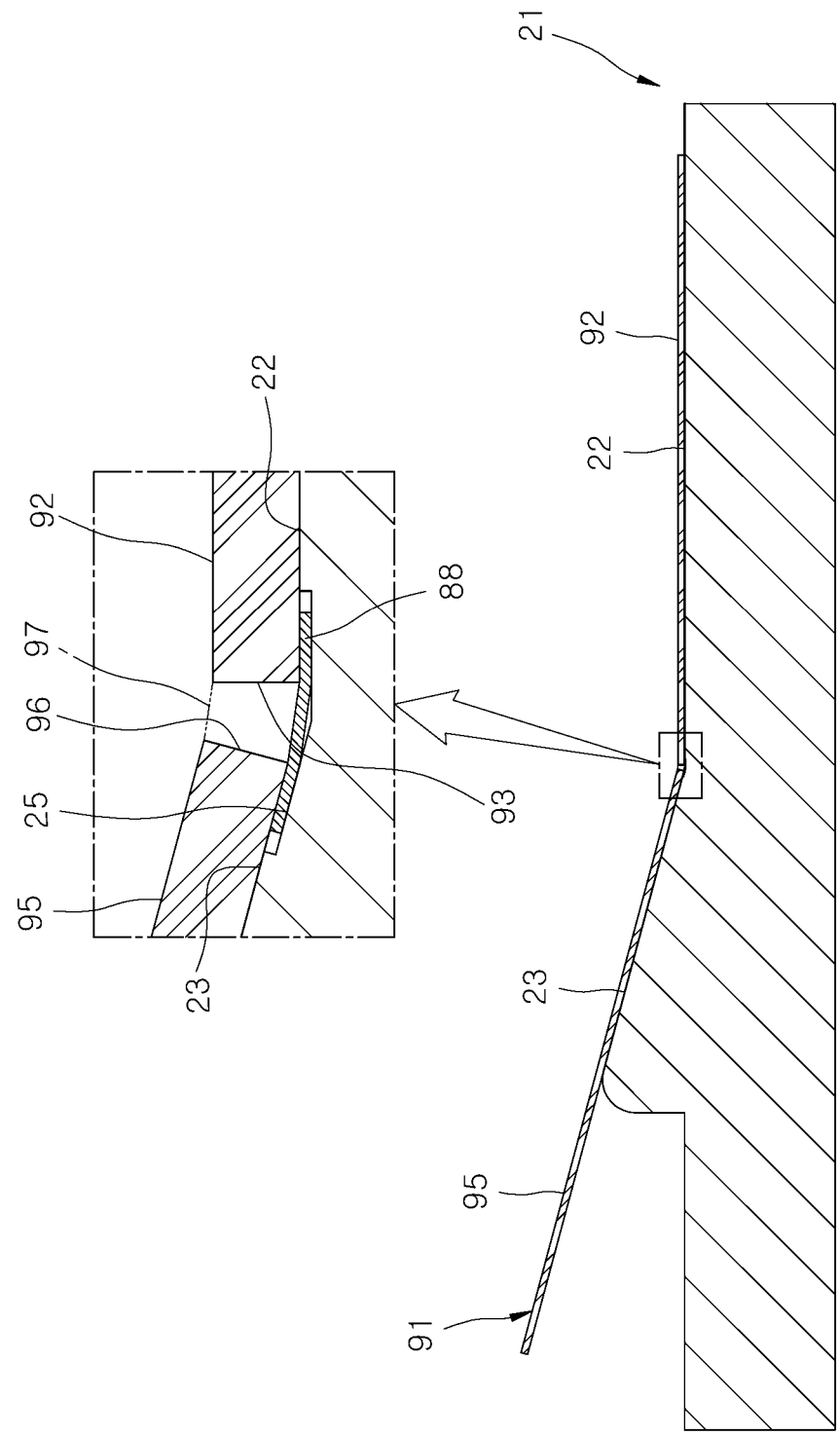
FIG. 6 is a cross-sectional view for describing a method of manufacturing a panel for a display device according to a third embodiment of the present invention.

FIG. 6 is a cross-sectional view for describing a method of manufacturing a panel for a display device according to a third embodiment of the present invention. Referring to FIG. 6, a method of manufacturing a panel 91 for a display device according to the third embodiment of the present invention includes providing a jig, mounting a unit panel, and forming a junction. The panel 91 for a display device may be, for example, a display unit or a protective glass portion of a display device.

The providing of the jig is an operation of providing a jig 21 having a first unit panel support surface 22 that supports a first unit panel 92 so as to be in surface contact therewith and a second unit panel support surface 23 that supports a second unit panel 95 so as to be in surface contact therewith. An angle between the first unit panel support surface 22 and the second unit panel support surface 23 is identical to an angle between the first unit panel 92 and the second unit panel 95. A release film attachment groove 25 is formed in the jig 21 to have a depth smaller than or equal to a thickness of a release film 88 so that the release film 88 is attached thereto. The release film attachment groove 25 is formed between the first unit panel support surface 22 and the second unit panel support surface 23 to extend parallel to the extension direction of edge surfaces 93 and 96 facing each other of the first unit panel 92 and the second unit panel 95.

The mounting of the unit panel is an operation of placing and supporting the first unit panel 92 on the first unit panel support surface 22 and placing and supporting the second unit panel 95 on the second unit panel support surface 23. In the junction forming operation, a junction is formed. Specifically, the forming of the junction includes attaching a release film, introducing an adhesive, curing the adhesive, and removing the release film.

The attaching of the release film is an operation of attaching the release film 88 between the first unit panel support surface 22 and the second unit panel support surface 23 so as to overlap a rear surface of the first unit panel 92 around an edge surface 93 thereof and a rear surface of the second unit panel 95 around an edge surface 96 thereof. Specifically, the release film attachment operation may include adjusting a position of a release film, in which the release film 88 is attached into the release film attachment groove 25 to be mounted therein in order to accurately adjust an attachment position of the release film 88, and overlapping a release film and a unit panel, in which the first unit panel 92 and the second unit panel 95 are placed and supported on the first unit panel support surface 22 and the second unit panel support surface 23, so that the edge surface 93 of the first unit panel 92 and the edge surface 96 of the second unit panel 95 overlap the release film 88 from the top and bottom thereof. The adjusting of the position of the release film may be performed prior to the mounting of the unit panel, and the overlapping of the release film and the unit panel may be performed simultaneously with the mounting of the unit panel.

The introducing of the adhesive is an operation of introducing and filling an adhesive 97 into a space between the edge surface 93 of the first unit panel 92 and the edge surface 96 of the second unit panel 95. Since the rear surface of the first unit panel 92 and the rear surface of the second unit panel 95, which are around the edge surfaces 93 and 96 facing each other, are in close contact with the release film 88, the adhesive 97 does not leak to a surface of the jig 21. The curing of the adhesive is an operation of curing the adhesive 97 introduced into the space between the edge surfaces 93 and 96 facing each other. The removing of the release film is an operation of extracting the first unit panel 92 and the second unit panel 95 bonded by the cured adhesive 97 from the jig 21 and separating the release film 88 from the cured adhesive 97 and the rear surfaces of the first and second unit panels 92 and 95. As a result, the panel 91 for a display device is completely manufactured.

Figure 7:
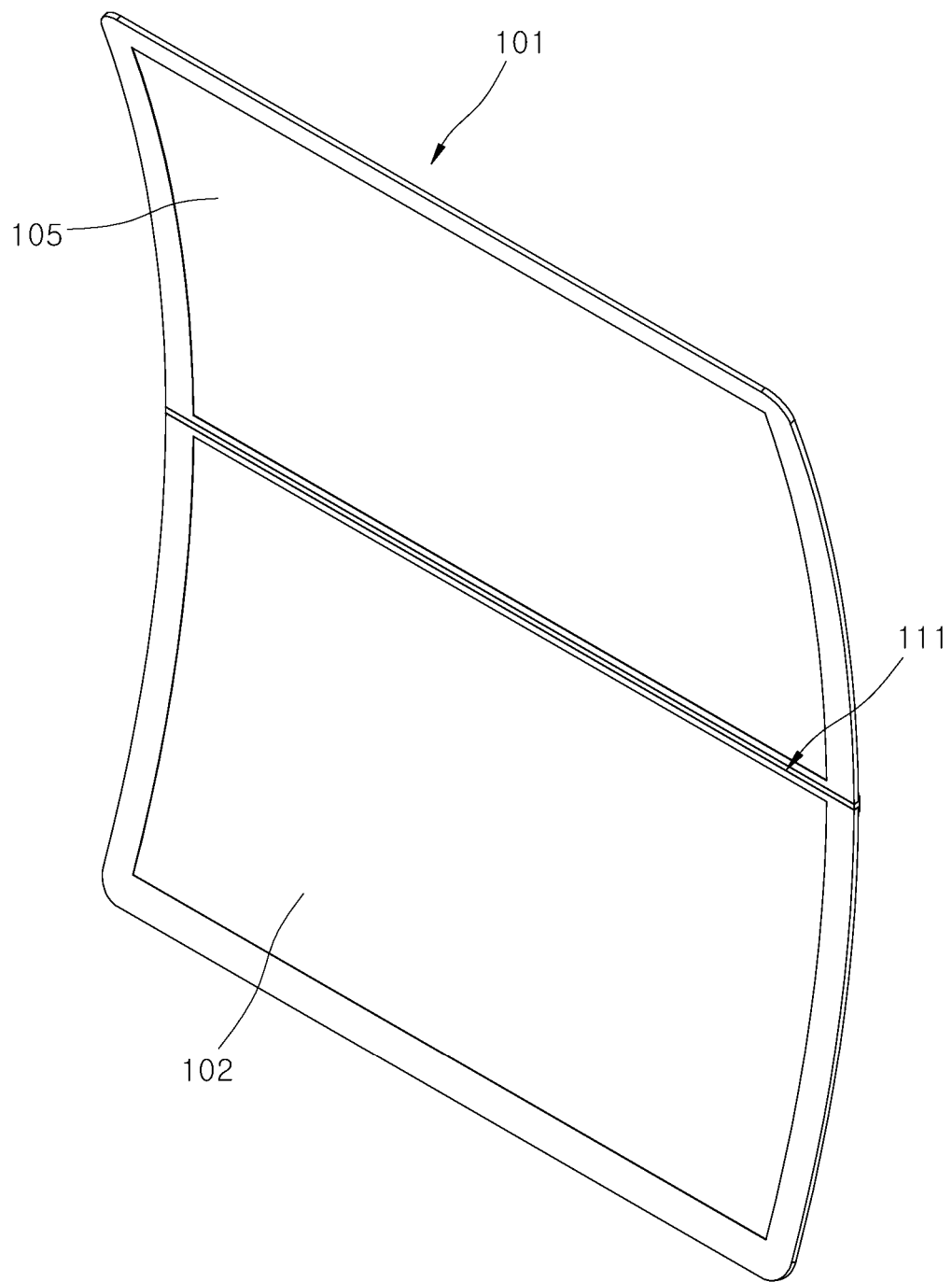
FIG. 7 is a perspective view illustrating a panel for a display device according to a fourth embodiment of the present invention.
Figure 8:
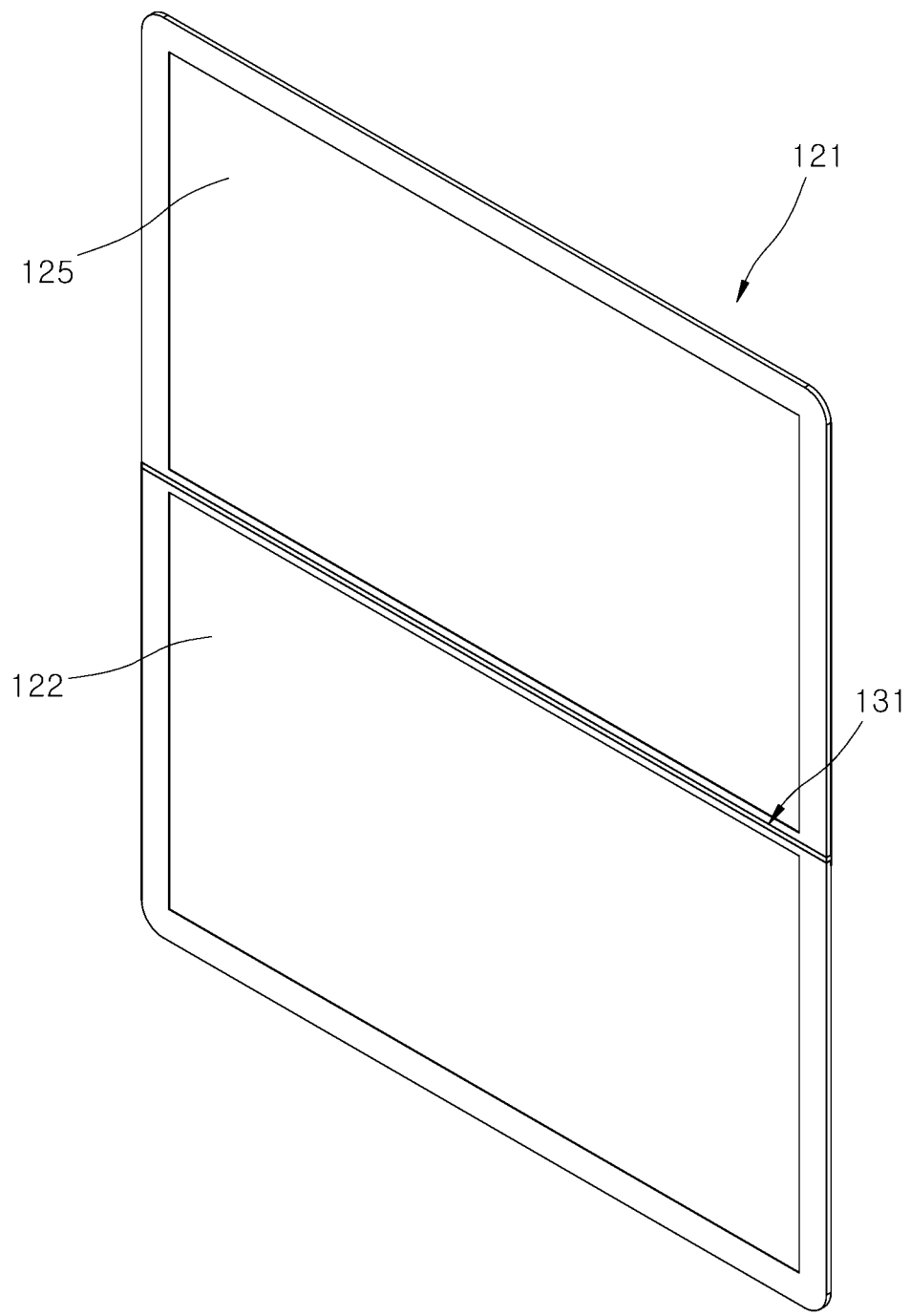
FIG. 8 is a perspective view illustrating a panel for a display device according to a fifth embodiment of the present invention.
Figure 9:
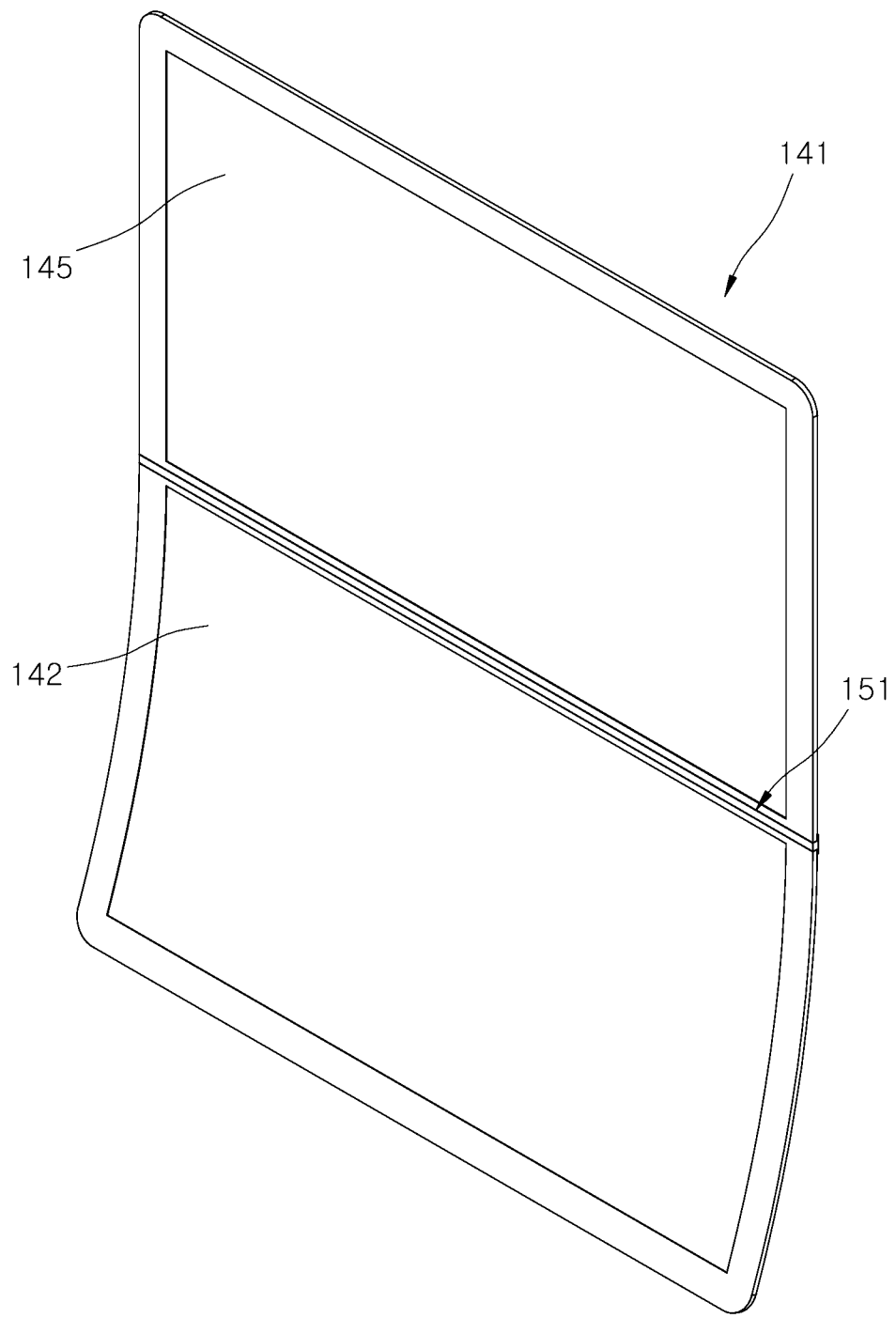
FIG. 9 is a perspective view illustrating a panel for a display device according to a sixth embodiment of the present invention.

FIG. 7 is a perspective view illustrating a panel for a display device according to a fourth embodiment of the present invention, FIG. 8 is a perspective view illustrating a panel for a display device according to a fifth embodiment of the present invention, and FIG. 9 is a perspective view illustrating a panel for a display device according to a sixth embodiment of the present invention.

Referring to FIG. 7, a panel 101 for a display device according to the fourth embodiment of the present invention, which is a protective glass portion of a display device having a curved front surface on which an image is displayed, includes a first unit panel 102, a second unit panel 105, and a junction. Each of the first unit panel 102 and the second unit panel 105 includes a transparent glass panel. The first unit panel 102 and the second unit panel 105 are the same as the first unit panel 32 and the second unit panel 40 described with reference to FIGS. 1 and 3 except that the first unit panel 102 and the second unit panel 105 are curved panels, and thus descriptions thereof will not be repeated.

The junction includes a bonding frame 111 and an adhesive that is introduced therein and cured. The junction is the same as the junction 50 including the bonding frame 51 and the adhesive 57 described with reference to FIGS. 1 and 3 except that the bonding frame 111 connects the first unit panel 102 to the second unit panel 105 so as not to be bent, and thus a description thereof will not be repeated.

Referring to FIG. 8, a panel 121 for a display device according to the fifth embodiment of the present invention, which is a protective glass portion of a display device having a flat front surface on which an image is displayed, includes a first unit panel 122, a second unit panel 125, and a junction. Each of the first unit panel 122 and the second unit panel 125 includes a transparent glass panel. The first unit panel 122 and the second unit panel 125 are flat panels and are the same as the first unit panel 32 and the second unit panel 40 described with reference to FIGS. 1 and 3, and thus descriptions thereof will not be repeated.

The junction includes a bonding frame 131 and an adhesive that is introduced therein and cured. The junction is the same as the junction 50 including the bonding frame 51 and the adhesive 57 described with reference to FIGS. 1 and 3 except that the bonding frame 131 connects the first unit panel 122 to the second unit panel 125 so as not to be bent, and thus a description thereof will not be repeated.

Referring to FIG. 9, a panel 141 for a display device according to the sixth embodiment of the present invention, which is a protective glass portion of a display device having a front surface on which an image is displayed, wherein a lower half of the front surface is a curved surface and an upper half of the front surface is a flat surface, includes a first unit panel 142 that is a curved panel, a second unit panel 145 that is a flat panel, and a junction. Each of the first unit panel 142 and the second unit panel 145 includes a transparent glass panel.

The first unit panel 142 is the same as the first unit panel 32 described with reference to FIGS. 1 and 3 except that the first unit panel 142 is a curved panel, and the second unit panel 145 is the same as the second unit panel 40 described with reference to FIGS. 1 and 3, and thus descriptions thereof will not be repeated.

The junction includes a bonding frame 151 and an adhesive that is introduced therein and cured. The junction is the same as the junction 50 including the bonding frame 51 and the adhesive 57 described with reference to FIGS. 1 and 3, and thus a description thereof will not be repeated.

Meanwhile, the panels for a display device of embodiments of the present invention are not limited to those in the embodiments illustrated in FIGS. 1 to 9, and may be modified in various ways, such as a form in which a flat unit panel and a curved unit panel are connected by a junction so as to be bent at a greater angle than a bending angle of the panel 141 illustrated in FIG. 9, a form in which a pair of curved unit panels are connected by a junction so as to be bent, and the like.

According to embodiments of the present invention, it is possible to easily manufacture a panel for a large bent display device, a panel for a large, curved display device, and a panel for a large flat display device by attaching a plurality of small-sized unit panels. Therefore, a yield of good products and productivity can be improved, and manufacturing costs can also be reduced. In particular, it is possible to easily manufacture a panel for a display device having a bending angle or a curvature that is greater than that of a case in which a single protective glass panel is deformed or cut to form a bent or curved panel. In other words, by attaching a plurality of panels for a display device by applying a junction using an adhesive, it is possible to implement a panel for a display device having a shape of any of various curvatures or angles without being affected by a shape or angle of an inflection point.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

The invention claimed is:

1. A panel for a display device, comprising:
   a first unit panel and a second unit panel that are consecutively disposed; and
   a junction configured to bond and connect an edge surface of the first unit panel to an edge surface of the second unit panel facing the edge surface of the first unit panel;
   wherein the junction includes:
      a bonding frame which is interposed between the edge surface of the first unit panel and the edge surface of the second unit panel and has an internal space formed therein, wherein outlets are formed in a first side surface of the bonding frame, which faces and is in contact with the edge surface of the first unit panel, and a second side surface of the bonding frame, which faces and is in contact with the edge surface of the second unit panel, and an inlet is formed in a front surface of the bonding frame in which the outlets are not formed; and
      an adhesive which fills the internal space of the bonding frame through the inlet and is applied to and cured on the edge surface of the first unit panel and the edge surface of the second unit panel through the outlets.

2. The panel of claim 1, wherein each of the first unit panel and the second unit panel includes a transparent glass panel.

3. The panel of claim 2, wherein each of the first unit panel and the second unit panel further includes a touch sensing unit attached to a rear surface of the transparent glass panel.

4. The panel of claim 2, wherein each of the first unit panel and the second unit panel further includes a bezel layer formed by printing and curing an opaque paint on an outer peripheral portion of the transparent glass panel, wherein a width of the bezel layer printed in a region of the outer peripheral portion close to an edge surface bonded to the junction is smaller than a width of the bezel layer printed in a region of the outer peripheral portion far from the edge surface bonded to the junction.

5. The panel of claim 1, wherein each of the first unit panel and the second unit panel includes a display panel having a front surface on which an image is displayed.

6. The panel of claim 1, wherein the bonding frame further includes flanges that extend in close contact with rear surfaces of the first unit panel and the second unit panel.

7. The method of claim 1, wherein the bonding frame further includes flanges that extend in close contact with rear surfaces of the first unit panel and the second unit panel, a bonding frame mounting groove, in which the flanges are placed between the first unit panel support surface and the second unit panel support surface, is formed in the jig, and in the bonding frame mounting operation, the bonding frame is mounted on the jig so that the flanges are placed in the bonding frame mounting groove.

8. A method of manufacturing a panel for a display device, the method comprising:
   a jig providing operation of providing a jig including a first unit panel support surface that supports a first unit panel and a second unit panel support surface that supports a second unit panel;
   a unit panel mounting operation of placing and supporting the first unit panel on the first unit panel support surface and placing and supporting the second unit panel on the second unit panel support surface; and
   a junction forming operation of forming a junction, wherein the junction forming operation includes:
      a bonding frame providing operation of providing a bonding frame having an internal space formed therein, outlets formed in a first side surface of the bonding frame, which faces and is in contact with an edge surface of the first unit panel, and a second side surface of the bonding frame, which faces and is in contact with an edge surface of the second unit panel, and an inlet formed in a front surface of the bonding frame in which the outlets are not formed;
      a bonding frame mounting operation of placing and supporting the bonding frame on the jig so that the first side surface of the bonding frame faces and is in contact with the edge surface of the first unit panel, the second side surface of the bonding frame faces and is in contact with the edge surface of the second unit panel, and the inlet is exposed;
      an adhesive introducing operation of introducing an adhesive into the bonding frame through the inlet so that the internal space of the bonding frame is filled with the adhesive and the adhesive is applied onto the edge surface of the first unit panel and the edge surface of the second unit panel through the outlets; and
      an adhesive curing operation of curing the adhesive.

9. The method of claim 8, wherein the junction forming operation includes:
   a release film attachment operation of attaching a release film between the first unit panel support surface and the second unit panel support surface so as to overlap a rear surface of the first unit panel around an edge surface thereof and a rear surface of the second unit panel around an edge surface thereof;
   an adhesive introducing operation of introducing and filling an adhesive into a space between the edge surface of the first unit panel and the edge surface of the second unit panel; and
   an adhesive curing operation of curing the adhesive.

10. The method of claim 8, wherein:
 each of the first unit panel and the second unit panel includes a transparent glass panel; and
 the method further includes a bezel layer forming operation of forming a bezel layer by printing and curing an opaque paint on an outer peripheral portion of the transparent glass panel.

11. A panel assembly including a panel for a display device, the panel comprising:
 a display unit; and
 a protective glass portion disposed in front of the display unit and configured to protect the display unit, wherein the protective glass portion includes a first unit panel and a second unit panel that are consecutively disposed, and
 a junction configured to bond and connect an edge surface of the first unit panel to an edge surface of the second unit panel facing the edge surface of the first unit panel;
 wherein the junction includes:
 a bonding frame which is interposed between the edge surface of the first unit panel and the edge surface of the second unit panel and has an internal space formed therein, wherein outlets are formed in a first side surface of the bonding frame, which faces and is in contact with the edge surface of the first unit panel, and a second side surface of the bonding frame, which faces and is in contact with the edge surface of the second unit panel, and an inlet is formed in a front surface of the bonding frame in which the outlets are not formed; and
 an adhesive which fills the internal space of the bonding frame through the inlet and is applied to and cured on the edge surface of the first unit panel and the edge surface of the second unit panel through the outlets.

\* \* \* \* \*